(12) United States Patent
Ko et al.

(10) Patent No.: US 10,748,884 B2
(45) Date of Patent: Aug. 18, 2020

(54) ELECTRONIC DEVICE WITH COMMON ELECTRODE

(71) Applicant: InnoLux Corporation, Miao-Li County (TW)

(72) Inventors: Hong-Pin Ko, Miao-Li County (TW); Chien-Chih Chen, Miao-Li County (TW)

(73) Assignee: INNOLUX CORPORATION, Chu-Nan, Miao-Li County (TW)

( * ) Notice: Subject to any disclaimer, the term of this patent is extended or adjusted under 35 U.S.C. 154(b) by 0 days.

(21) Appl. No.: 16/265,316

(22) Filed: Feb. 1, 2019

(65) Prior Publication Data

US 2019/0304960 A1 Oct. 3, 2019

Related U.S. Application Data

(60) Provisional application No. 62/649,995, filed on Mar. 29, 2018.

(30) Foreign Application Priority Data

Jun. 7, 2018 (CN) .......................... 2018 1 0579946

(51) Int. Cl.
*H01L 25/16* (2006.01)
*H01L 33/64* (2010.01)
(Continued)

(52) U.S. Cl.
CPC ............ *H01L 25/167* (2013.01); *H01L 24/05* (2013.01); *H01L 24/06* (2013.01); *H01L 24/08* (2013.01); *H01L 33/647* (2013.01); *H01L 33/62* (2013.01); *H01L 2224/05547* (2013.01); *H01L 2224/05551* (2013.01); *H01L 2224/0603* (2013.01);
(Continued)

(58) Field of Classification Search
CPC ............... H01L 24/07–09; H01L 33/62; H01L 2924/1204–12041; H01L 2224/07; H01L 2224/08; H01L 2224/0801; H01L 2224/0805–0807; H01L 2224/081; H01L 2224/08111–08112; H01L 2224/0812; H01L 2224/08123; H01L 2224/08145–08151; H01L 2224/08175; H01L 2224/08187–08188;
(Continued)

(56) References Cited

U.S. PATENT DOCUMENTS

2017/0323873 A1* 11/2017 Lin

* cited by examiner

*Primary Examiner* — Sonya D. McCall-Shepard
(74) *Attorney, Agent, or Firm* — Muncy, Geissler, Olds & Lowe, P.C.

(57) ABSTRACT

An electronic device is disclosed which includes: a substrate; a plurality of active elements disposed on the substrate; a common electrode disposed on the active elements and including a plurality of openings; and a plurality of light-emitting elements, at least one of the light-emitting elements disposed on the common electrode partially, wherein the light-emitting elements each include a first pad and a second pad, and the first pad and the second pad are disposed on a same side of each said light-emitting element, wherein the first pad of one of the light-emitting elements is disposed corresponding to one of the openings of the common electrode and the first pad of the one of the light-emitting elements electrically connects to one of the active elements, and the second pad electrically connects to the common electrode.

19 Claims, 10 Drawing Sheets

(51) Int. Cl.
*H01L 23/00* (2006.01)
*H01L 33/62* (2010.01)

(52) U.S. Cl.
CPC ............... *H01L 2224/06051* (2013.01); *H01L 2224/06131* (2013.01); *H01L 2224/08123* (2013.01); *H01L 2224/08145* (2013.01); *H01L 2924/12041* (2013.01); *H01L 2924/1426* (2013.01); *H01L 2924/351* (2013.01)

(58) Field of Classification Search
CPC ..... H01L 2933/0058–0066; H01L 33/36–387; H01L 27/124; H01L 27/15–156
See application file for complete search history.

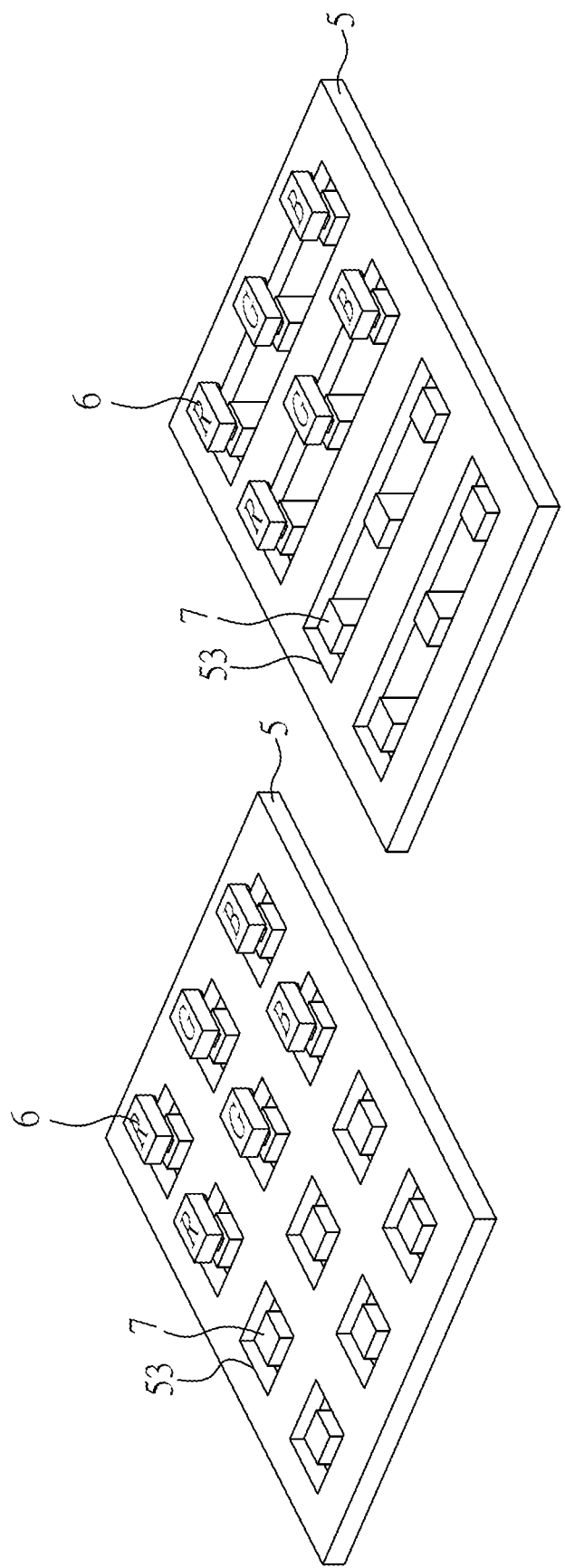

ELECTRONIC DEVICE WITH COMMON ELECTRODE

CROSS REFERENCE TO RELATED APPLICATION

This application claims the benefit of filing date of U. S. Provisional Application Ser. No. 62/649,995, filed Mar. 29, 2018 under 35 USC § 119(e)(1).

This application also claims the benefits of the Chinese Patent Application Serial Number 201810579946.6, filed on Jun. 7, 2018, the subject matter of which is incorporated herein by reference.

BACKGROUND

1. Field

The present disclosure relates to electronic devices and, more particularly, to an electronic device with a common electrode.

2. Description of Related Art

Owing to technological advancement of display devices, an increasingly large number of display devices are active displays. In this regard, using light-emitting diodes as light-emitting elements has two advantages: the light-emitting elements can be used to construct backlight modules of liquid crystal display devices; and the light-emitting elements can directly function as display devices applicable to public information displays (PID), lighting and decorations.

However, conventional tiled electronic devices are usually passive electronic devices. Drawbacks of passive electronic devices are: heavily dependent on integrated circuit (IC) components, incur high costs, or consume much electric power. Even if passive tiled electronic devices are replaced with active tiled electronic devices, the active tiled electronic devices have a drawback: during the connection process of light-emitting diodes (LED) of the active tiled electronic devices, the generated heat or stress may press destructively or damage circuits, resulting in the detriment of implementation.

Therefore, it is imperative to provide a novel electronic device advantageous in that, during the connection process of the light-emitting diodes (LED), the problem of pressing destructively or damaging underlying circuits and electronic components can be prevented.

SUMMARY

It is an objective of the present disclosure to provide an electronic device with a common electrode electrically connected to a pad of each light-emitting element such that stress or heat generated during a connection process of the light-emitting elements can be shared equally by the common electrode to prevent underlying circuits from being pressed destructively or damaged, so as to enhance process yield and reliability.

The present disclosure provides an electronic device, comprising: a substrate; a plurality of active elements disposed on the substrate; a common electrode disposed on the active elements and comprising a plurality of openings; and a plurality of light-emitting elements, at least one of the light-emitting elements disposed on the common electrode partially, wherein the light-emitting elements each comprise a first pad and a second pad, and the first pad and the second pad are disposed on a same side of each said light-emitting element, wherein the first pad of one of the light-emitting elements is disposed corresponding to one of the openings of the common electrode and the first pad of the one of the light-emitting elements electrically connects to one of the active elements, and the second pad electrically connects to the common electrode.

BRIEF DESCRIPTION OF THE DRAWINGS

FIG. 3A is a schematic view of a portion of the electronic device according to another embodiment of the present disclosure;

FIG. 3B is a schematic view of a portion of the electronic device according to another embodiment of the present disclosure;

DETAILED DESCRIPTION

Implementation of the present disclosure is hereunder illustrated by specific embodiments. Persons skilled in art may refer to the disclosure herein and thus easily gain insight into the other advantages and effects of the present disclosure. Furthermore, the present disclosure may be implemented or applied in the other specific embodiments. Details disclosed herein may be subject to various modifications and changes without departing from the spirit of the present disclosure with a view to conforming with different viewpoints and applications.

Ordinal numbers, such as "first," "second" and "third," used herein are intended to distinguish components rather than disclose explicitly or implicitly that names of the components bear the wording of the ordinal numbers. The ordinal numbers do not imply what order a component and another component are in terms of space, time or steps of a manufacturing method. The ordinal numbers are intended to distinguish a component with a name from another component with the same name.

Directive terms, such as "above," "on" and "up," used herein may refer to two components in direct contact with each other or refer to two components not in direct contact with each other.

The present disclosure is hereunder described with illustrative embodiments, but the present disclosure is not limited thereto. The present disclosure may combine with any other structure to form any another embodiment.

Figure 1A:
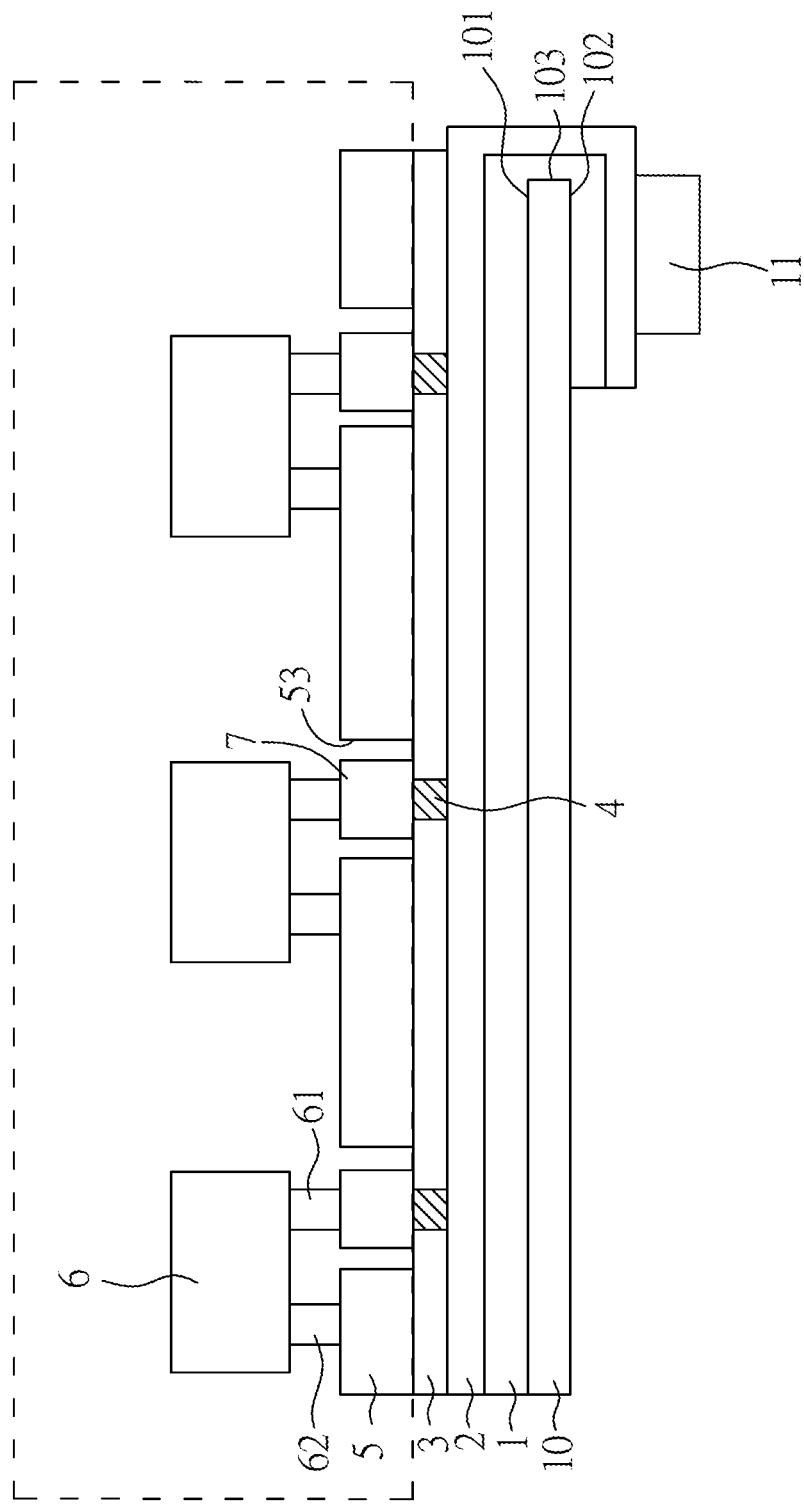
FIG. 1A is a cross-sectional view of a portion of an electronic device according to an embodiment of the present disclosure.
Figure 1B:
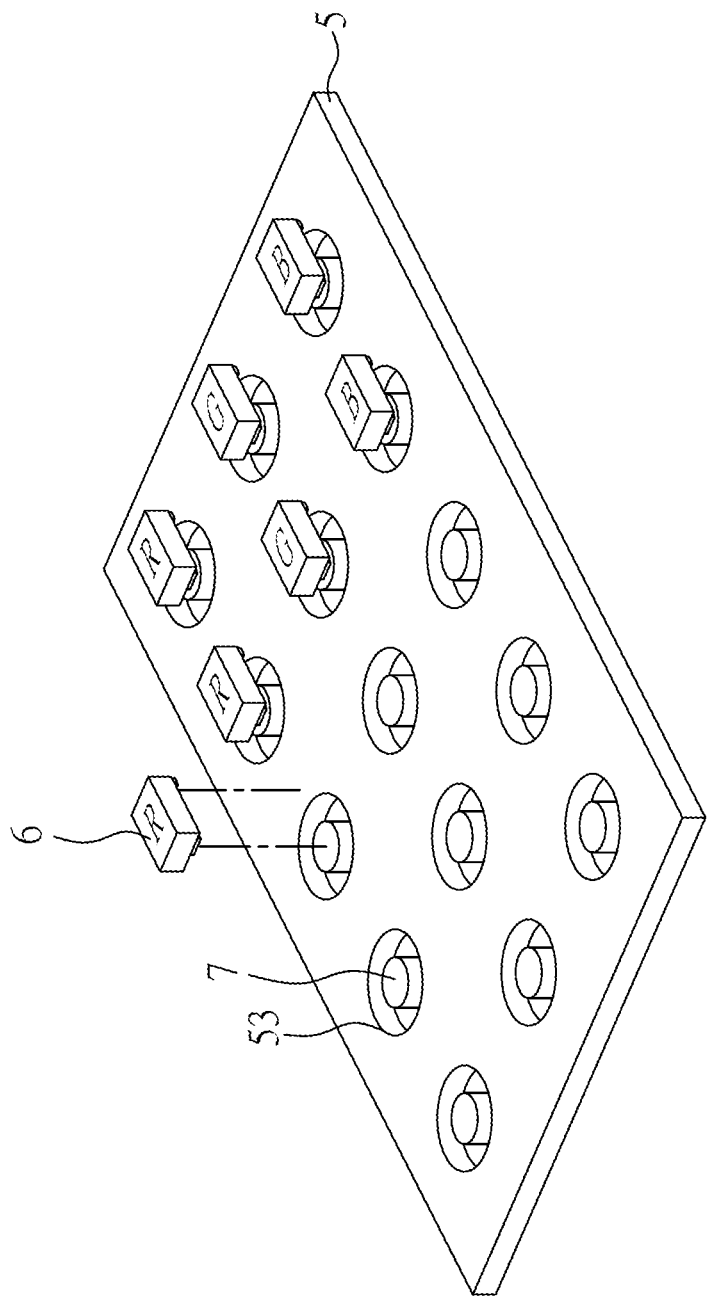
FIG. 1B is a schematic view of a dashed line portion of FIG. 1A.

Referring to FIG. 1A and FIG. 1B, there is shown in FIG. 1A a cross-sectional view of a portion of an electronic device according to an embodiment of the present disclosure, and there is shown in FIG. 1B a schematic view of a dashed line portion of FIG. 1A. As shown in FIG. 1A and FIG. 1B, the electronic device of the present disclosure comprises: a substrate 1, an active layer 2, an insulating layer 3, a conductive unit 4, a common electrode 5, a conductive electrode 7, and a plurality of light-emitting elements 6. The common electrode 5 has a plurality of openings 53. The light-emitting elements 6 each have a first pad 61 and a second pad 62. The first pad 61 electrically connects to the active layer 2 through the conductive electrode 7 disposed in one of the openings 53 and the conductive unit 4 penetrating the insulating layer 3. The second pad 62 electrically connects to the common electrode 5.

During the connection process of light-emitting elements, the generated heat or stress may press destructively or damage circuits. Therefore, according to the present disclosure, with a common electrode, the stress or heat generated during the connection process of the light-emitting elements is shared equally by the common electrode to prevent underlying circuits from being pressed destructively or damaged, so as to enhance process yield and reliability.

Figure 2:
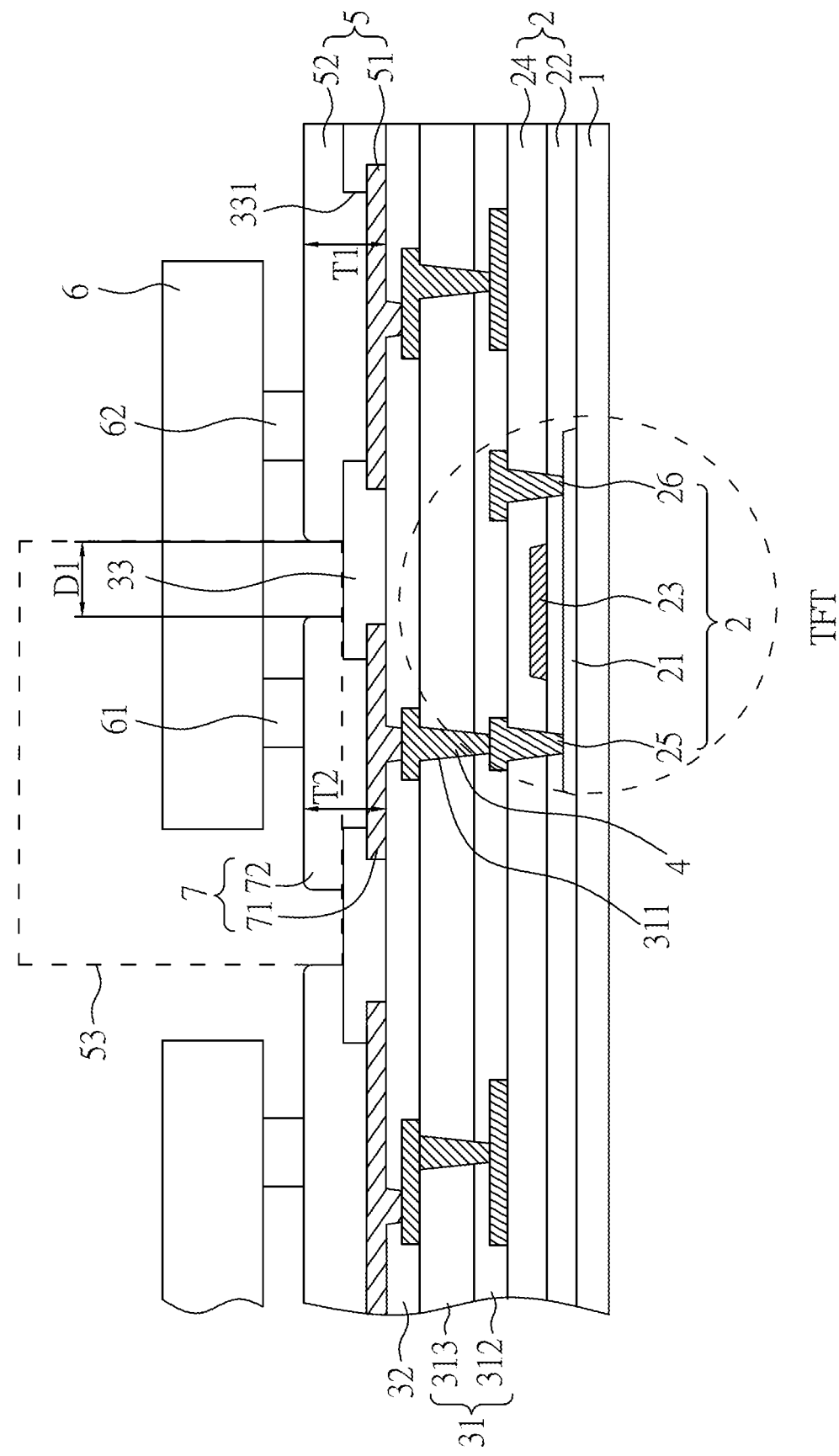
FIG. 2 is a cross-sectional view of a portion of the electronic device according to an embodiment of the present disclosure.

Referring to FIG. 2, there is shown a cross-sectional view of a portion of the electronic device according to an embodiment of the present disclosure. First, a substrate 1 is provided. Then, an active layer 2 is formed on the substrate 1. The active layer 2 comprises a plurality of active elements TFT. The active elements TFT each comprise a semiconductor layer 21, a gate insulating layer 22 disposed on the semiconductor layer 21, a gate electrode 23 disposed on the gate insulating layer 22, a third insulating layer 24 disposed on the gate electrode 23, and a first electrode 25 and a second electrode 26 disposed on the third insulating layer 24. In an embodiment of the present disclosure, the active elements TFT are thin film transistors. The first electrode 25 and the second electrode 26 are respectively a drain electrode or a source electrode.

Afterward, a first insulating layer 31 is formed on the active layer 2, followed by forming a conductive unit 4. The first insulating layer 31 comprises a through hole 311. The conductive unit 4 is disposed in the through hole 311 and electrically connected to the first electrode 25.

Afterward, a fourth insulating layer 32 is formed on the conductive unit 4. A first patterned metal layer (comprising the first common electrode layer 51 and the first metal layer 71) is formed on the fourth insulating layer 32 by lithography. Afterward, a fifth insulating layer 33 is formed on the first patterned metal layer (comprising the first common electrode layer 51 and the first metal layer 71). The fifth insulating layer 33 comprises a second opening 331. The second opening 331 corresponds in position to the first patterned metal layer (comprising the first common electrode layer 51 and the first metal layer 71). A second patterned metal layer (comprising the second common electrode layer 52 and the second metal layer 72) is deposited on the first patterned metal layer (comprising the first common electrode layer 51 and the first metal layer 71) by a sputtering process to thereby form a display panel of this embodiment. Afterward, the light-emitting elements 6 are mounted on the display panel by a surface mount technique (SMT) to form the electronic device of this embodiment.

The aforesaid layers are intended to exemplify illustrative embodiments, but the present disclosure is not limited thereto.

The substrate 1 may comprise a quartz substrate, a glass substrate, a wafer, a sapphire substrate or any other rigid substrate. Furthermore, the substrate 1 may comprise a flexible substrate or a thin film, which may comprise polycarbonate (PC), polyimide (PI), polypropylene (PP), polyethylene terephthalate (PET), or any other plastic material. The gate electrode 23 may have a monolayer or multilayer structure and comprise a metal, such as copper (Cu), titanium (Ti), or aluminum (Al), a metallic alloy, or a conductive material, but the present disclosure is not limited thereto. The gate insulating layer 22, the first insulating layer 31, the third insulating layer 24, the fourth insulating layer 32 and the fifth insulating layer 33 may comprise silicon nitride, silicon dioxide, silicon oxynitride, aluminum oxide, polymer, photoresist, or a combination thereof, and may comprise identical or different materials, but the present disclosure is not limited thereto. The first electrode 25, the second electrode 26 and the conductive unit 4 may comprise a metal, such as copper (Cu), titanium (Ti), or aluminum (Al), or a conductive material, but the present disclosure is not limited thereto. The first patterned metal layer (comprising the first common electrode layer 51 and the first metal layer 71) and the second patterned metal layer (comprising the second common electrode layer 52 and the second metal layer 72) may have a monolayer or multilayer structure and may comprise a metal, such as copper (Cu), nickel (Ni), gold (Au), or silver (Ag), a metal alloy, or a conductive material, but the present disclosure is not limited thereto. In this regard, the light-emitting elements 6 are light-emitting diodes (LED), but the present disclosure is not limited thereto.

In this embodiment, the electronic device made by the aforesaid manufacturing process comprises: a substrate 1; a plurality of active elements TFT disposed on the substrate 1; a common electrode 5 disposed on the active elements TFT and comprising a plurality of openings 53; and a plurality of light-emitting elements 6, at least one of the light-emitting elements 6 disposed on the common electrode 5 partially. The light-emitting elements 6 each comprise a first pad 61 and a second pad 62. The first pad 61 and the second pad 62 are disposed on a same side of each said light-emitting element 6. In an embodiment of the present disclosure, the light-emitting elements 6 may comprise a light-emitting layer or multiple quantum well (MQW). The first pad 61 and the second pad 62 are disposed on a same side of the light-emitting layer or the multiple quantum well. The first pad 61 of one of the light-emitting element 6 is disposed corresponding to one of the openings 53 of the common electrode 5 and the first pad 61 of the one of the light-emitting element 6 electrically connects to one of the active elements TFT. The second pad 62 electrically connects to the common electrode 5.

With the common electrode 5, the stress or heat generated during the connection process of the light-emitting elements 6 can be shared equally by the common electrode 5 to prevent underlying circuits from being damaged. The common electrode 5 can block light or increase heat-dissipation area, thereby reducing light-induced leakage current or heat-induced leakage current.

In this embodiment, the common electrode 5 may comprise a first common electrode layer 51 and a second common electrode layer 52. The common electrode 5 has a thickness T1 greater than or equal to 0.02 µm but less than or equal to 100 µm. In another embodiment of the present disclosure, the thickness T1 may be greater than or equal to 0.2 µm but less than or equal to 10 µm. In further another embodiment of the present disclosure, the thickness T1 may be greater than or equal to 2 µm but less than or equal to 5 µm. But, the present disclosure is not limited thereto.

In this embodiment, the electronic device may further comprise a conductive electrode 7 disposed in one of the openings 53. The conductive electrode 7 penetrates one of the openings 53. The first pad 61 electrically connects to one of the active elements TFT through the conductive electrode 7. The conductive electrode 7 may comprise a first metal layer 71 and a second metal layer 72. The thickness T2 of the conductive electrode 7 may be greater than or equal to 0.02 µm but less than or equal to 100 µm. In another embodiment of the present disclosure, the thickness T2 of the conductive electrode 7 is greater than or equal to 0.2 µm but less than or equal to 10 µm. In further another embodiment of the present disclosure, the thickness T2 of the conductive electrode 7 is greater than or equal to 2 µm but less than or equal to 5 µm. But, the present disclosure is not limited thereto. As shown in FIG. 2, the conductive electrode 7 and the common electrode 5 are separated by a distance D1, and the distance D1 is greater than or equal to 2 µm but less than or equal to 100 µm, for example, greater than or equal to 2 µm but less than or equal to 10 µm, but the present disclosure is not limited thereto. In this embodiment, the first metal layer 71 and the second metal layer 72 are cathodes or anodes.

In this embodiment, the electronic device may further comprise a first insulating layer 31. The first insulating layer 31 is disposed between the common electrode 5 and the active elements TFT. The first insulating layer 31 comprises a through hole 311. The electronic device may further comprise a conductive unit 4 disposed in the through hole 311. The conductive electrode 7 electrically connects to one of the active elements TFT through the conductive unit 4. In this embodiment, optionally, the first insulating layer 31 may selectively have a multilayer structure. For instance, the first insulating layer 31 may comprise a passivation layer 312, and a planer layer 313 disposed on the passivation layer 312, but the present disclosure is not limited thereto. The materials which the passivation layer 312 and the planer layer 313 are made of may comprise silicon nitride, silicon dioxide, silicon oxynitride, aluminum oxide, polymer, photoresist, or a combination thereof, but the present disclosure is not limited thereto.

In an embodiment of the present disclosure, as shown in FIG. 1A, the electronic device may further comprise a supporting base 10. The supporting base 10 comprises a first surface 101, a second surface 102 opposing the first surface 101, and a side surface 103 connecting the first surface 101 and the second surface 102. The substrate 1 comprises at least three portions disposed on the first surface 101, the second surface 102 and the side surface 103, respectively. The supporting base 10 may comprise a quartz substrate, a glass substrate, a wafer, a sapphire substrate, a soft-rigid composite board or any other rigid substrate. The supporting base 10 may comprise a flexible substrate or a thin film, which comprises polycarbonate (PC), polyimide (PI), polypropylene (PP), polyethylene terephthalate (PET), or any other plastic material, but the present disclosure is not limited thereto.

In an embodiment of the present disclosure, as shown in FIG. 1A, the electronic device may further comprise a driving unit 11 correspondingly disposed on the second surface 102 and coupled to the active layer 2. The driving unit 11 is coupled to the active layer 2 by being directly electrically connected to the active layer 2 or being indirectly electrically connected to the active layer 2 through a component. The driving unit 11 can be an integrated circuit (IC), but the present disclosure is not limited thereto.

This embodiment of the present disclosure is not restrictive of the shape of the openings 53, as the openings 53 may be of any shape, provided that the shape of the openings 53 enables the conductive electrode 7 to penetrate one of the openings 53 and enables the first pad 61 to be electrically connected to one of the active elements TFT through the conductive electrode 7. For instance, the openings 53 are round, oval, rectangular, or of irregular shape, but the present disclosure is not limited thereto. Referring to FIG. 3A, there is shown a schematic view of a portion of the electronic device according to another embodiment of the present disclosure. The electronic device shown in FIG. 3A is the same as the electronic device shown in FIG. 1A, FIG. 1B and FIG. 2, except that the openings 53 shown in FIG. 3A are rectangular.

Referring to FIG. 3B, there is shown a schematic view of a portion of the electronic device according to another embodiment of the present disclosure. The electronic device shown in FIG. 3B is the same as the electronic device shown in FIG. 3A, except for differences described below. Regarding the electronic device shown in FIG. 3A, the common electrode 5 has a plurality of openings 53. The openings 53 correspond in position to the light-emitting elements 6, respectively. The first pads 61 of the light-emitting elements 6 are disposed corresponding to the openings 53 of the common electrode 5, respectively.

Regarding the electronic device of this embodiment, as shown in FIG. 3B, the common electrode 5 has a plurality of openings 53. The openings 53 correspond in position to the light-emitting elements 6, respectively. The first pads (not shown) of at least two of the light-emitting elements 6 are disposed corresponding to one of the openings 53 of the common electrode 5. In this embodiment, the first pads of three said light-emitting elements 6 correspond in position to one of the openings 53 of the common electrode 5.

Figure 4B:
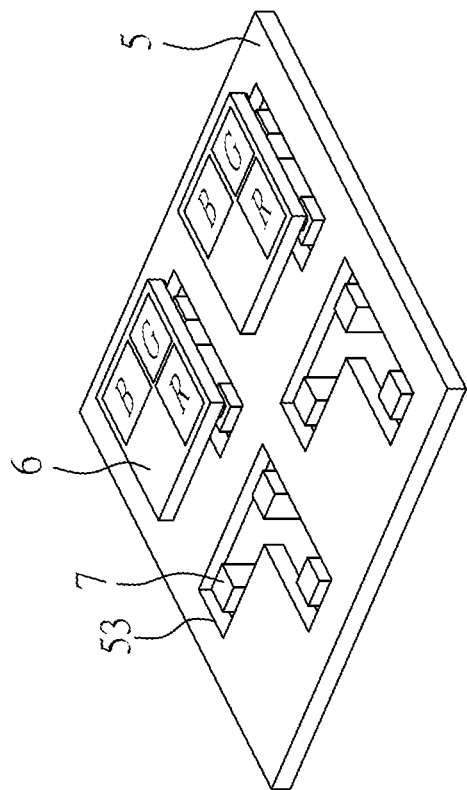
FIG. 4B is a schematic view of a portion of the electronic device according to another embodiment of the present disclosure.
Figure 4A:
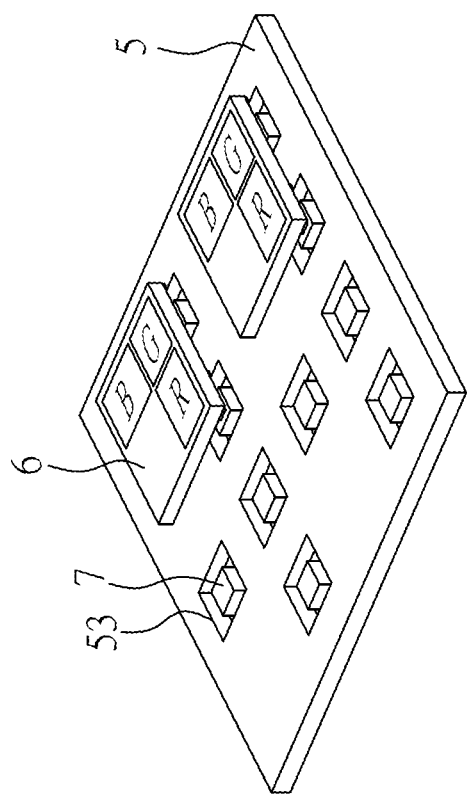
FIG. 4A is a schematic view of a portion of the electronic device according to another embodiment of the present disclosure.

Referring to FIG. 4A and FIG. 4B, there are shown schematic views of a portion of the electronic device according to another embodiment of the present disclosure. The electronic device shown in FIG. 4A and FIG. 4B is the same as the electronic device shown in FIG. 3A and FIG. 3B, except that the light-emitting elements 6 shown in FIG. 3A and FIG. 3B are monochromatic light-emitting diodes, whereas the light-emitting elements 6 shown in FIG. 4A and FIG. 4B are multicolor light-emitting diodes, but the present disclosure is not limited thereto. Hence, the present disclosure will achieve its objective, provided that a pad of the light-emitting elements electrically connects to the common electrode such that the stress or heat generated during the connection process of the light-emitting elements 6 is shared equally by the common electrode 5. Light emitted varies from light-emitting element to light-emitting element in color, such as red, blue, green or white, but the present disclosure is not limited thereto.

Figure 5:
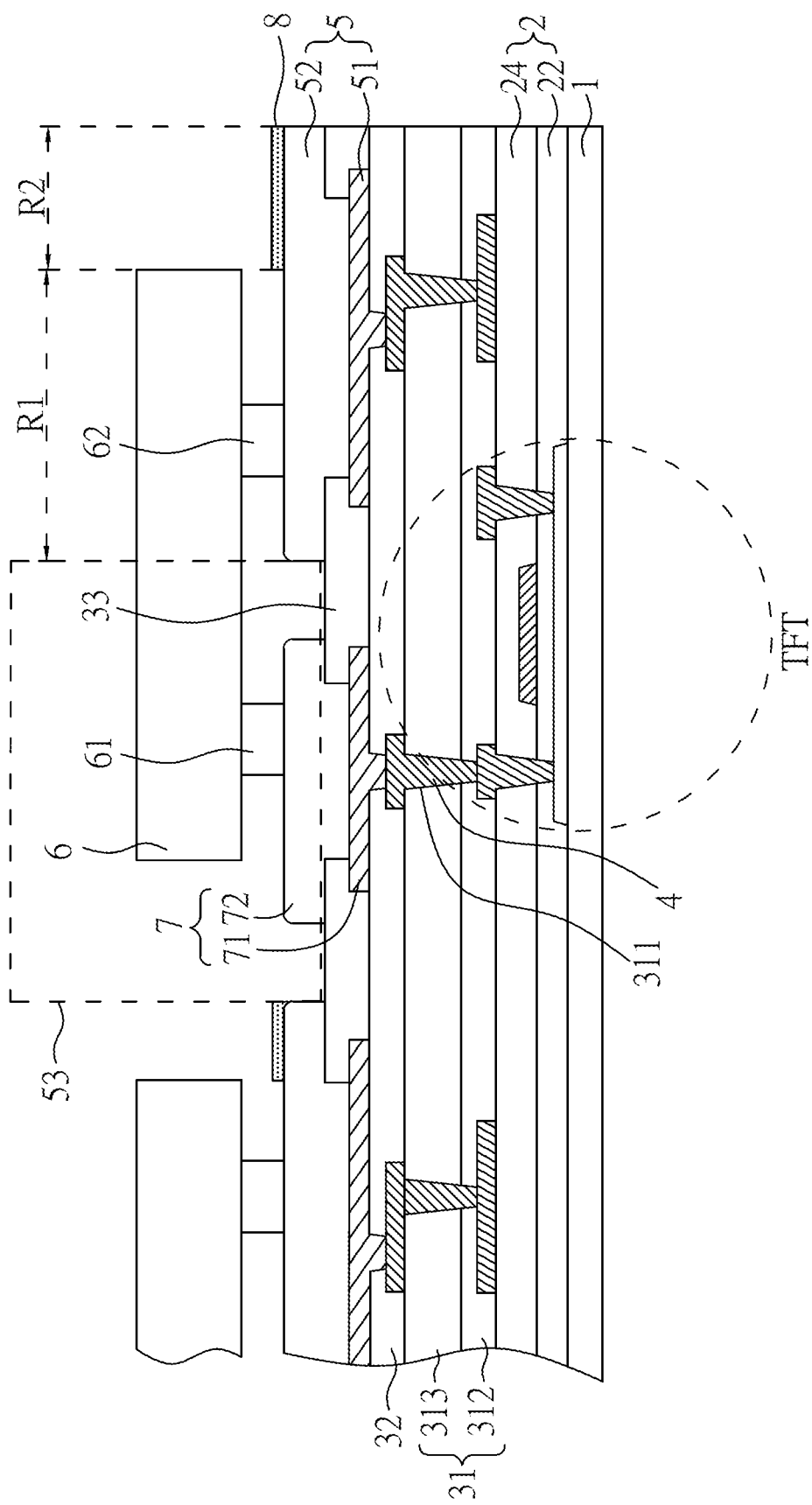
FIG. 5 is a cross-sectional view of a portion of the electronic device according to another embodiment of the present disclosure.

Referring to FIG. 5, there is shown a cross-sectional view of a portion of the electronic device according to another embodiment of the present disclosure. The electronic device shown in FIG. 5 is the same as the electronic device shown in FIG. 2, except that the electronic device shown in FIG. 5 further comprises a light-absorbing layer 8 disposed on the common electrode 5. The common electrode 5 comprises a first region R1 and a second region R2. The first region R1 overlaps the light-emitting elements 6 in view of a normal direction of the substrate 1, whereas the second region R2 does not overlap the light-emitting elements 6 in view of the normal direction of the substrate 1, with the light-absorbing layer 8 disposed on the second region R2, but the present disclosure is not limited thereto. For instance, the light-absorbing layer 8 may be also disposed on the conductive electrode 7 to further augment the contrast effect of the light-emitting elements 6 and thus enhance display quality. Alternatively, the light-absorbing layer 8 may be also disposed on the first region R1 but may have openings corresponding in position to the pads of the light-emitting elements 6 if the light-absorbing layer 8 comprises an insulating material; hence, the state in which the light-emitting elements 6 are electrically connected to the active elements TFT is maintained. The light-absorbing layer 8 can be a black ink layer, a black resin layer, an adhesive tape, an anti-reflective coating, a black metal layer or a light-absorbing material layer, but the present disclosure is not limited thereto. The light-absorbing layer 8 will work well, provided that the light-absorbing layer 8 is capable of reducing reflecting light and augmenting the contrast effect of the light-emitting elements 6.

Figure 6:
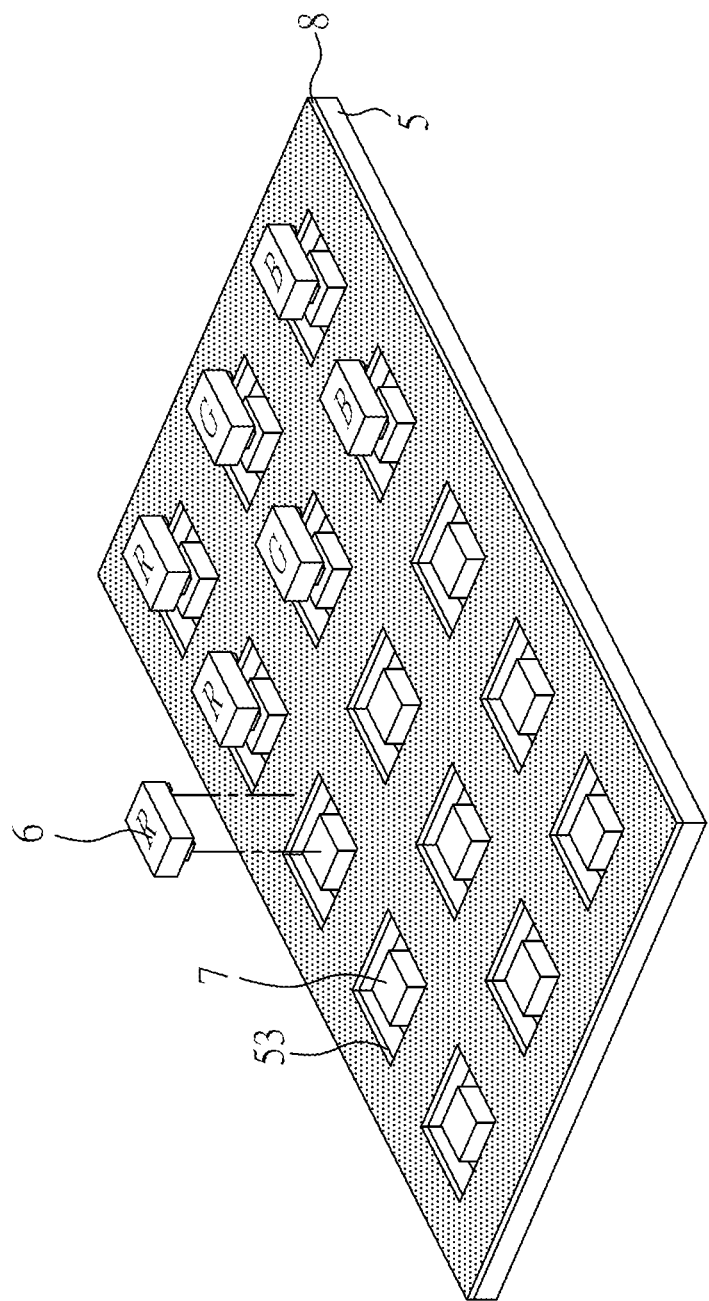
FIG. 6 is a schematic view of a portion of the electronic device according to another embodiment of the present disclosure.

Referring to FIG. 6, there is shown a schematic view of a portion of the electronic device according to another embodiment of the present disclosure. The electronic device shown in FIG. 6 is the same as the electronic device shown in FIG. 5, except that the light-absorbing layer 8 of the electronic device shown in FIG. 6 is a black metal layer. The black metal layer is disposed on the common electrode 5. The black metal layer covers all the surfaces of the common electrode 5. However, the present disclosure is not limited thereto. Alternatively, the black metal layer is disposed on a region not overlapping the light-emitting elements 6 (for example, the second region R2 shown in FIG. 5). Alternatively, the black metal layer is disposed on the conductive electrode 7. When the light-absorbing layer 8 is a black metal layer, it prevents the light-emitting elements 6 from causing damage to the light-absorbing layer 8 during a rework process.

In this embodiment, the black metal layer may comprise molybdenum oxide, copper oxide, or a combination thereof, but the present disclosure is not limited thereto. The black metal layer is of a thickness greater than or equal to 100 Å but less than or equal to 5 μm, but the present disclosure is not limited thereto.

Figure 7A:
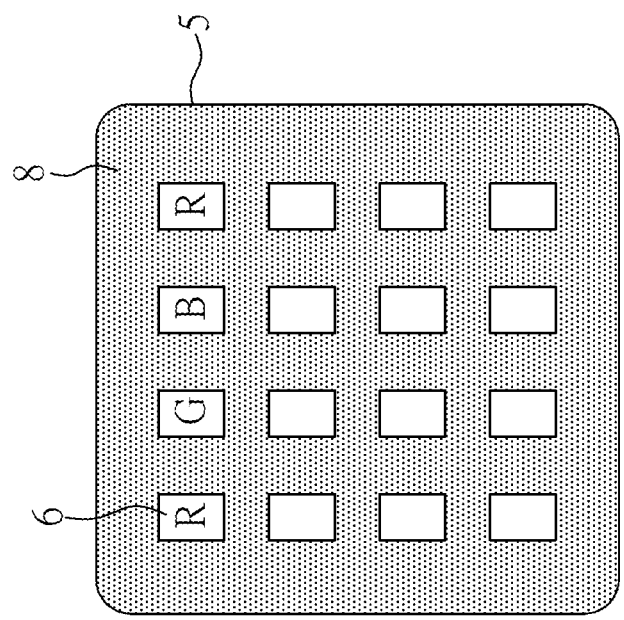
FIG. 7A to FIG. 7D are top views of the electronic devices of the present disclosure.
Figure 7B:
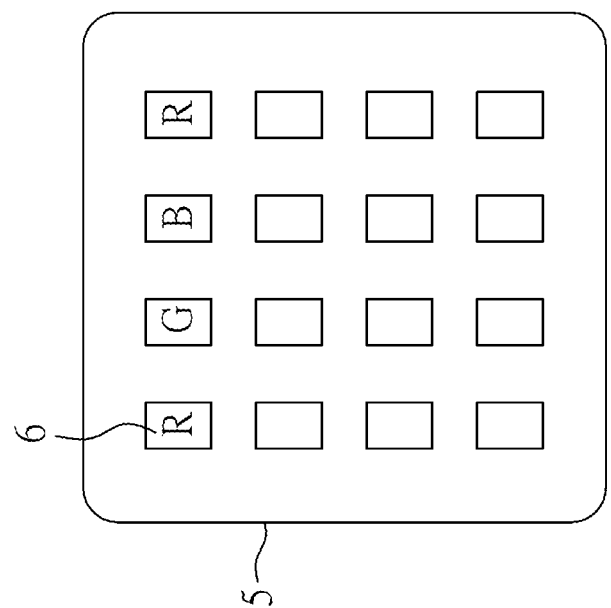
Figure 7D:
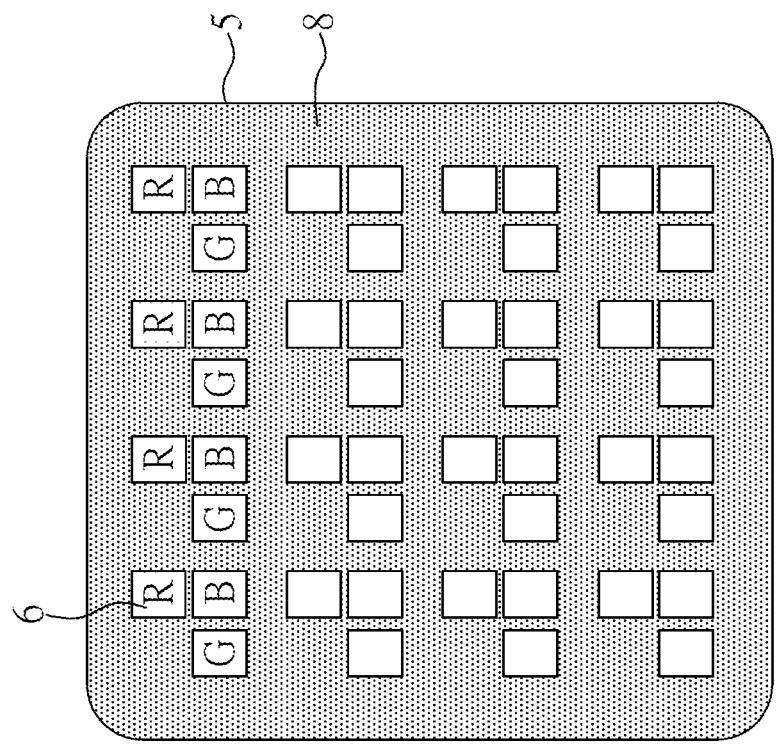
Figure 7C:
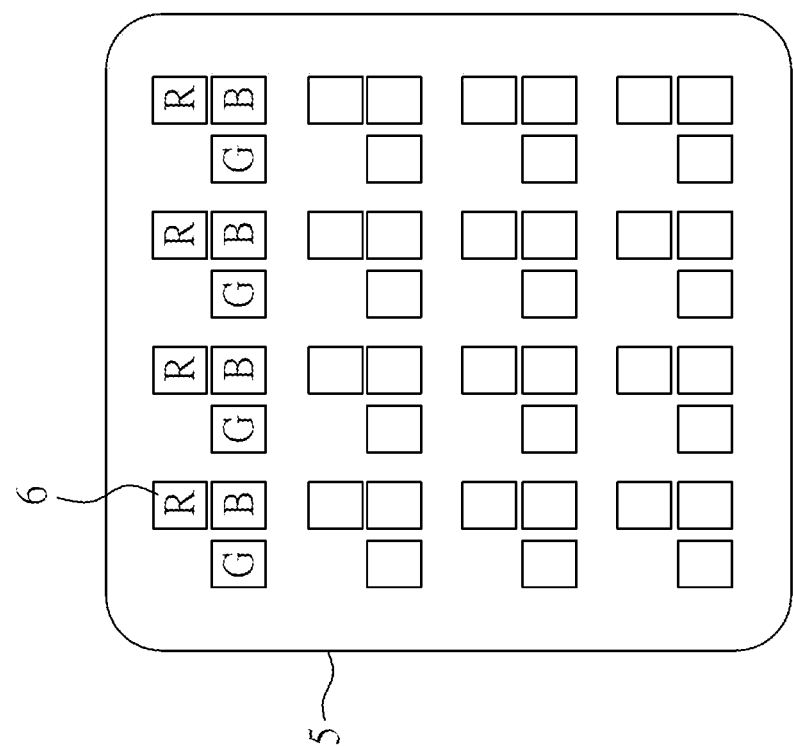

Referring to FIG. 7A to FIG. 7D, there are shown top views of the electronic device of the present disclosure. FIG. 7A is a top view based on FIG. 3A. FIG. 7C is a top view based on FIG. 4A. FIG. 7B is a top view based on FIG. 6. The electronic device comprises a black metal layer for functioning as the light-absorbing layer 8. From the perspective of the top views, with the black metal layer being disposed on the common electrode 5 not overlapping the light-emitting elements 6, the problem that light emitted from the light-emitting elements 6 is reflected by the common electrode 5 is reduced, so as to augment the contrast effect of the light-emitting elements 6, thereby enhancing the display quality. The electronic device shown in FIG. 7D is the same as the electronic device shown in FIG. 7B, except that the light-emitting elements 6 of the electronic device shown in FIG. 7D are multicolor light-emitting diodes (LED), but the present disclosure is not limited thereto.

Figure 8:
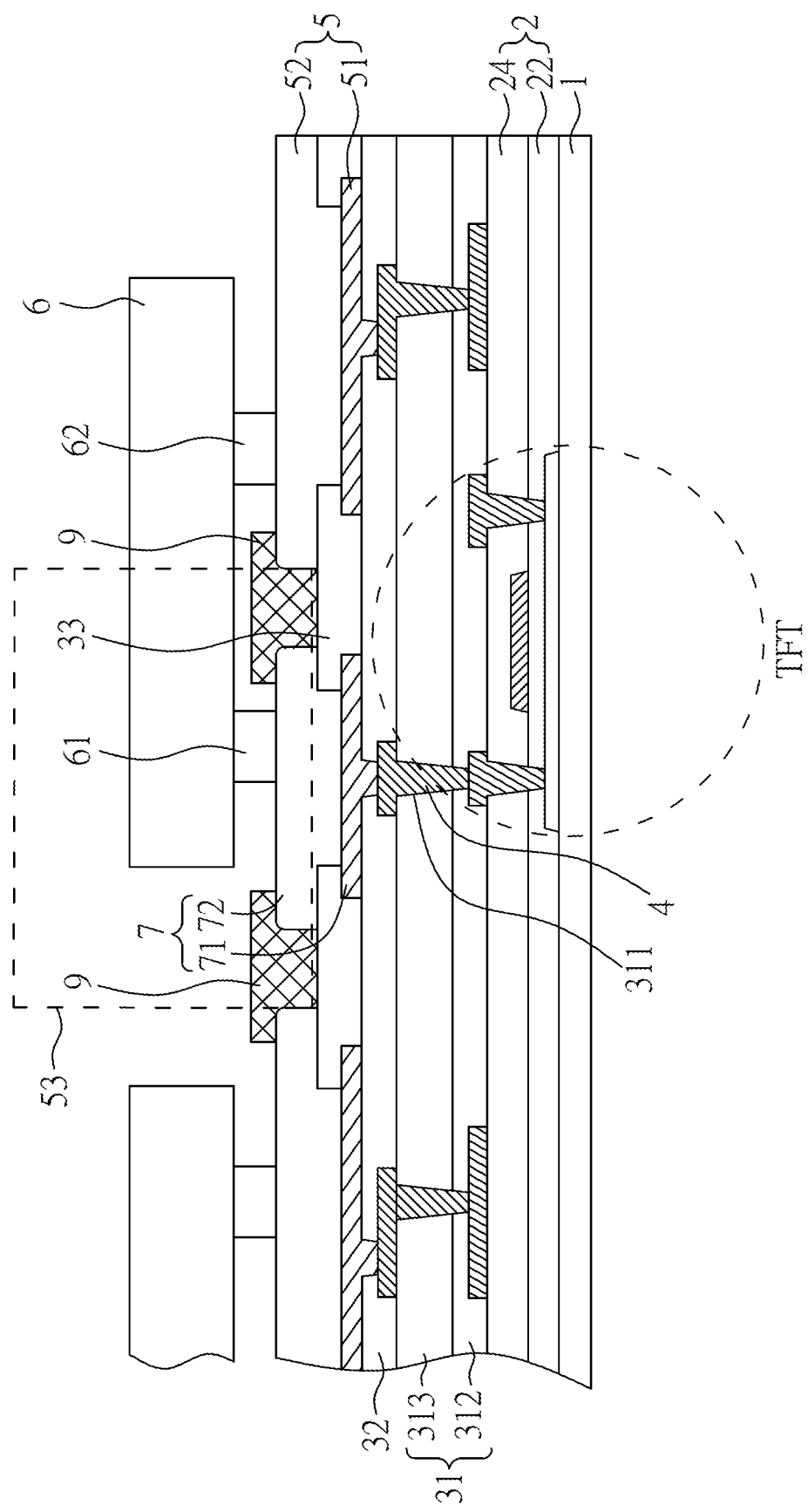
FIG. 8 is a cross-sectional view of a portion of the electronic device according to another embodiment of the present disclosure.

Referring to FIG. 8, there is shown a cross-sectional view of a portion of the electronic device according to another embodiment of the present disclosure. The electronic device shown in FIG. 8 is the same as the electronic device shown in FIG. 1 through FIG. 6, except that the electronic device shown in FIG. 8 may further comprise a second insulating layer 9 disposed between the common electrode 5 and the conductive electrode 7. The second insulating layer 9 is disposed in the openings 53 and corresponds in position to the fifth insulating layer 33. At least a portion of the second insulating layer 9 is disposed on the common electrode 5 or the conductive electrode 7 to further prevent a short circuit from developing between the common electrode 5 and the conductive electrode 7.

In another embodiment of the present disclosure, the electronic device shown in FIG. 1 through FIG. 8 is, for example, implemented as a tiled electronic device, display device, antenna device, detection (or sensing) device or backlight device, the present disclosure is not limited thereto.

In conclusion, according to the present disclosure, an electronic device comprises a common electrode whereby stress or heat generated during the connection process of light-emitting elements is shared equally by the common electrode to prevent underlying circuits from being damaged, so as to enhance process yield and reliability.

The electronic device of the present disclosure is applicable to various display devices, such as a display device comprising liquid-crystals (LCs), organic light-emitting diodes (OLEDs), quantum dots (QDs), fluorescence materials, phosphor materials, light-emitting diodes (LEDs), micro light-emitting diodes or mini light-emitting diodes, or any other display medium, but the present disclosure is not limited thereto. In an embodiment of the present disclosure, the display device is, for example, a flexible display device, a touch display device, a curved display device or a tiled display device, but the present disclosure is not limited thereto.

The above specific embodiment must be interpreted to be illustrative, rather than restrictive in any way, of any other disclosure herein.

What is claimed is:

1. An electronic device, comprising:
   a substrate;
   a plurality of active elements disposed on the substrate;
   a common electrode disposed on the active elements and comprising a plurality of openings;
   a conductive electrode disposed in one of the openings, wherein the conductive electrode and the common electrode are separated by a distance greater than or equal to 2 μm but less than or equal to 100 μm; and
   a plurality of light-emitting elements, at least one of the light-emitting elements disposed on the common electrode partially, wherein the light-emitting elements each comprise a first pad and a second pad, and the first pad and the second pad are disposed on a same side of each said light-emitting element,
   wherein the first pad of one of the light-emitting elements is disposed corresponding to one of the openings of the common electrode and the first pad of the one of the light-emitting elements electrically connects to one of the active elements, and the second pad electrically connects to the common electrode.

2. The electronic device of claim 1, wherein the first pad of the one of the light-emitting elements electrically connects to one of the active elements through the conductive electrode.

3. The electronic device of claim 1, comprising a first insulating layer and a conductive unit, wherein the first insulating layer is disposed between the common electrode and the active elements and comprises a through hole, the conductive unit is disposed in the through hole, and the conductive electrode is electrically connected to one of the active elements via the conductive unit.

4. The electronic device of claim 1, comprising a second insulating layer disposed between the common electrode and the conductive electrode.

5. The electronic device of claim 1, wherein the conductive electrode comprises a first metal layer and a second metal layer.

6. The electronic device of claim 1, wherein a thickness of the conductive electrode is greater than or equal to 0.02 μm but less than or equal to 100 μm.

7. The electronic device of claim 1, comprising a light-absorbing layer disposed on at least one of the common electrode and the conductive electrode.

8. The electronic device of claim 7, wherein the light-absorbing layer comprises a black metal layer.

9. The electronic device of claim 1, comprising a light-absorbing layer disposed on the common electrode.

10. The electronic device of claim 9, wherein the light-absorbing layer comprises a black metal layer.

11. The electronic device of claim 9, wherein the light-absorbing layer comprises a black resin layer.

12. The electronic device of claim 9, wherein the common electrode comprises a first region and a second region, the first region overlap the light-emitting elements in view of a normal direction of the substrate, and the second region does not overlap the light-emitting elements in view of the normal direction of the substrate, wherein the light-absorbing layer is disposed on the second region.

13. The electronic device of claim 1, wherein the first pads of the light-emitting elements are disposed corresponding to the openings of the common electrode, respectively.

14. The electronic device of claim 1, wherein the first pads of at least two of the light-emitting elements are disposed corresponding to one of the openings of the common electrode.

15. The electronic device of claim 1, wherein a thickness of the common electrode is greater than or equal to 0.02 μm but less than or equal to 100 μm.

16. The electronic device of claim 1, wherein at least one of the light-emitting elements comprises a multicolor light-emitting diode.

17. The electronic device of claim 1, wherein at least one of the active elements comprises a thin film transistor.

18. The electronic device of claim 1, comprising a supporting base, wherein the supporting base comprises a first surface, a second surface opposing the first surface, and a side surface connecting the first surface and the second surface, wherein the substrate comprises at least three portions respectively disposed on the first surface of the supporting base, the second surface of the supporting base and the side surface of the supporting base.

19. The electronic device of claim 1, wherein the common electrode comprises a first common electrode layer and a second common electrode layer.

\* \* \* \* \*